US010616965B1

United States Patent
Goddard

(10) Patent No.: US 10,616,965 B1
(45) Date of Patent: Apr. 7, 2020

(54) PASSIVE ILLUMINATION RAMPING CIRCUIT

(71) Applicant: B/E Aerospace, Inc., Winston-Salem, NC (US)

(72) Inventor: James Goddard, Portsmouth (GB)

(73) Assignee: B/E Aerospace, Inc., Winston-Salem, NC (US)

( * ) Notice: Subject to any disclaimer, the term of this patent is extended or adjusted under 35 U.S.C. 154(b) by 0 days.

(21) Appl. No.: 16/424,914

(22) Filed: May 29, 2019

(51) Int. Cl.
*H05B 33/08* (2006.01)
*H03K 17/30* (2006.01)

(52) U.S. Cl.
CPC ..... *H05B 33/0821* (2013.01); *H05B 33/0845* (2013.01)

(58) Field of Classification Search
CPC ................ H05B 33/08; H05B 33/0821; H05B 33/0827; H05B 33/083; H05B 33/084; H05B 33/0845; H03K 17/30; H03K 17/302; H03K 17/687
See application file for complete search history.

(56) References Cited

U.S. PATENT DOCUMENTS

| | | | | |
|---|---|---|---|---|
| 2,892,952 A * | 6/1959 | McVey | H03K 4/58 | 327/132 |
| 5,828,244 A * | 10/1998 | Palara | H03K 17/04123 | 327/108 |
| 6,897,707 B2 * | 5/2005 | Beck | H03K 17/302 | 327/112 |

* cited by examiner

*Primary Examiner* — Thai Pham
(74) *Attorney, Agent, or Firm* — Suiter Swantz pc llo

(57) ABSTRACT

A passive illumination ramping circuit for a light-emitting diode (LED) is disclosed. In one or more embodiments, the illumination ramping circuit includes a first control path configured to control an on time of the LED and a second control path configured to control an off time of the LED. In embodiments, the first control path includes a first resistor in series with a first diode, and the second control path includes a second resistor in series with a second diode. The first and second control paths are in parallel with one another, in between a first node and a second node. The illumination ramping circuit further includes a capacitor coupled between the second node and an electrical ground. The illumination ramping circuit further includes a transistor for switching the LED on and off, the transistor including a gate terminal coupled to the second node.

18 Claims, 2 Drawing Sheets

PASSIVE ILLUMINATION RAMPING CIRCUIT

BACKGROUND

Illumination ramping circuits for light-emitting diodes (LEDs) are typically based on active circuitry (e.g., components that inject power into the circuit and/or control the current (energy) flow within the circuit). As a result, illumination ramping circuits may require more space to implement, have greater power requirements, and/or generate more heat than other types of circuits that are mostly or entirely made of passive components. Aircraft cabins and other environments where space, power, and heat dissipation are under tight constraints may benefit from a passive illumination ramping circuit.

SUMMARY

A passive illumination ramping circuit for a light-emitting diode (LED) is disclosed. In one or more embodiments, the illumination ramping circuit includes a first control path configured to control an on time of the LED and a second control path configured to control an off time of the LED. In embodiments, the first control path includes a first resistor in series with a first diode, and the second control path includes a second resistor in series with a second diode. The first and second control paths are in parallel with one another, in between a first node and a second node. The illumination ramping circuit further includes a capacitor coupled between the second node and an electrical ground. The illumination ramping circuit further includes a transistor for switching the LED on and off, the transistor including a gate terminal coupled to the second node.

In some embodiments of the illumination ramping circuit, the illumination ramping circuit further includes a third resistor coupled between a source terminal of the transistor and the LED.

In some embodiments of the illumination ramping circuit, the third resistor is coupled to an anode of the LED.

In some embodiments of the illumination ramping circuit, the transistor further includes a drain terminal coupled to a power input for the LED.

In some embodiments of the illumination ramping circuit, the illumination ramping circuit further includes a fourth resistor coupled between an enable input and the first node and a fifth resistor coupled between the enable input and the electrical ground.

In some embodiments of the illumination ramping circuit, the first diode and the second diode are oppositely oriented in between the first node and the second node.

In some embodiments of the illumination ramping circuit, the first node is coupled to an anode of the first diode and a cathode of the second diode, and the second node is coupled to a cathode of the first diode and an anode of the first diode.

In some embodiments of the illumination ramping circuit, the first diode is coupled to the first node or the second node via the first resistor, and the second diode is coupled to the first node or the second node via the second resistor.

In some embodiments of the illumination ramping circuit, at least one of the first and second resistors is adjustable.

A system that includes a device with at least one light source coupled to or embedded in the device is also disclosed. In one or more embodiments, the light source includes a LED with a first control path configured to control an on time of the LED and a second control path configured to control an off time of the LED. In embodiments, the first control path includes a first resistor in series with a first diode, and the second control path includes a second resistor in series with a second diode. The first and second control paths are in parallel with one another, in between a first node and a second node. The light source further includes a capacitor coupled between the second node and an electrical ground. The light source further includes a transistor for switching the LED on and off, the transistor including a gate terminal coupled to the second node.

In some embodiments of the system, the light source further includes a third resistor coupled between a source terminal of the transistor and the LED.

In some embodiments of the system, the third resistor is coupled to an anode of the LED.

In some embodiments of the system, the transistor further includes a drain terminal coupled to a power input for the LED.

In some embodiments of the system, the light source further includes a fourth resistor coupled between an enable input and the first node and a fifth resistor coupled between the enable input and the electrical ground.

In some embodiments of the system, the first diode and the second diode are oppositely oriented in between the first node and the second node.

In some embodiments of the system, the first node is coupled to an anode of the first diode and a cathode of the second diode, and the second node is coupled to a cathode of the first diode and an anode of the first diode.

In some embodiments of the system, the first diode is coupled to the first node or the second node via the first resistor, and the second diode is coupled to the first node or the second node via the second resistor.

In some embodiments of the system, at least one of the first and second resistors is adjustable.

In some embodiments of the system, the device is a light fixture.

In some embodiments of the system, the device is a user interface device.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
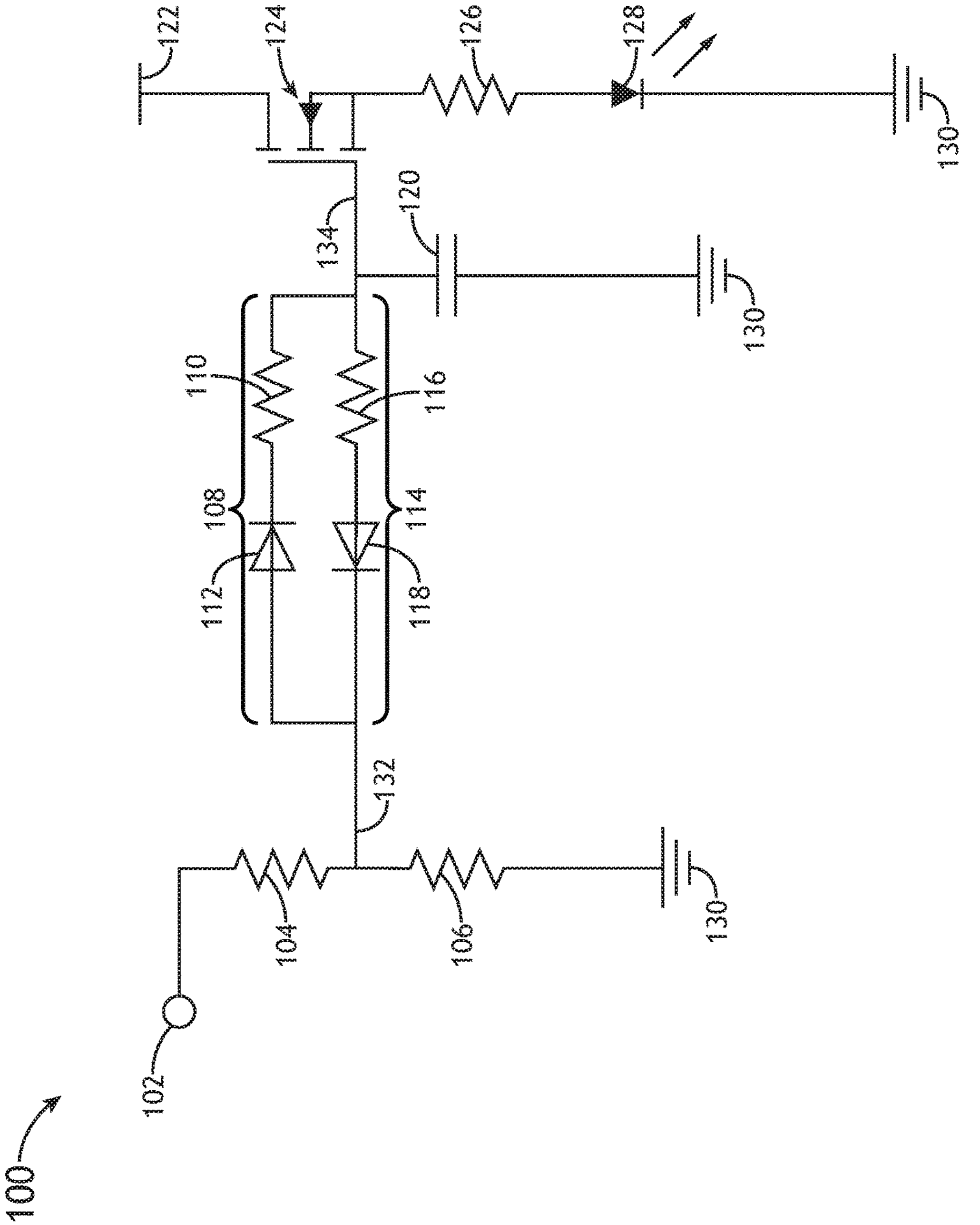
FIG. 1 is a circuit diagram of a light source including an illumination ramping circuit for a LED, in accordance with one or more embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

A passive illumination ramping circuit for a light-emitting diode (LED) is disclosed. Illumination ramping circuits for LEDs are typically based on active circuitry (e.g., components that inject power into the circuit and/or control the current (energy) flow within the circuit). As a result, illumination ramping circuits may require more space to implement, have greater power requirements, and/or generate more heat than other types of circuits that are mostly or entirely made of passive components. Accordingly, the passive illumination ramping circuit disclosed herein may be beneficial for light systems/devices in Aircraft cabins and other environments where space, power, and heat dissipation are under tight constraints.

FIG. 1 illustrates circuitry for a light source 100 that includes at least one LED 128 driven by a passive illumination ramping circuit. In one or more embodiments, the illumination ramping circuit includes a first control path 108 configured to control an "on time" of the LED 128 (e.g., an amount of time the LED 128 is switched on and/or sufficiently powered to emit perceptible/detectable light) and a second control path 114 configured to control an "off time" of the LED 128 (e.g., an amount of time the LED 128 is switched off and/or not sufficiently powered to emit perceptible/detectable light). In embodiments, the first control path 108 includes a resistor 110 in series with a diode 112. In embodiments, the second control path 114 also includes a resistor 116 in series with a diode 118.

The first and second control paths 108 and 114 are in parallel with one another, in between a first node 132 and a second node 134. The illumination ramping circuit further includes a capacitor 120 coupled between the second node 134 and an electrical ground 130. The output/signal at the second node 134 may be configured to drive a transistor 124 for switching the LED 128 on and off. For example, the second node 134 may be coupled to a gate terminal of the transistor 124. In some embodiments, the transistor 124 (e.g., a MOSFET or the like) includes a drain terminal coupled to a power input 122 of the illumination ramping circuit that provides an electrical signal to power the LED 128. In this configuration, the output/signal at the source terminal of the transistor 124 is configured to drive the LED 128. In some embodiments, the illumination ramping circuit further includes a resistor 126 coupled between the source terminal of the transistor 124 and the LED 128. For example, the resistor 126 may be coupled to the source terminal of the transistor 124 and an anode of the LED 128, where the cathode of the LED 128 is coupled to the electrical ground 130. In other embodiments, polarity of one or more components (e.g., LED 128) may be reversed, or one or more components may be bidirectional.

The illumination ramping circuit may further include a resistor 104 between an enable input 102 and the first node 132 and another resistor 106 between the first node 132 and the electrical ground 130. In embodiments, the enable input 102 may be configured to receive a signal for enabling (e.g., turning on or activating) the illumination ramping circuit from a controller, switch, sensor, or the like. For example, the illumination ramping circuit may be configured to drive the LED 128 in response to a signal at the enable input 102.

In embodiments, the first and second control paths 108 and 114 are configured such that diode 112 and diode 118 are oppositely oriented in between the first node 132 and the second node 134. For example, the first node 132 may be coupled to an anode of diode 112 and a cathode of diode 118, and the second node 134 may be coupled to a cathode of diode 112 and an anode of diode 118. In embodiments, diode 112 may be coupled to the first node 132 or the second node 134 via resistor 110, and similarly, diode 118 may be coupled to the first node 132 or the second node 134 via resistor 116. For example, as shown in FIG. 1, resistor 110 may be coupled between the diode 112 and the second node 134, and resistor 116 may be coupled between diode 118 and the second node 134.

The "on time" defined by the first control path 108 and the "off time" defined by the second control path 114 are based on the resistance values of resistors 110 and 116, respectively. In some embodiments, the resistors 110 and 116 are selected based on specified "on time" and "off time" values for the illumination ramping circuit. In other embodiments, resistors 110 and/or resistor 116 may be adjustable so that the “on time” and/or “off time” values for the illumination ramping circuit can be controlled by adjusting the resistance value of resistors 110 and/or resistor 116 (i.e., without having to replace a resistor). For example, at least one of the resistors 110 and 116 may be a variable resistor, potentiometer, or the like.

Various embodiments of a light source 100 including a passive illumination ramping circuit have been described with reference to FIG. 1. However, in other embodiments, the light source 100 and/or illumination ramping circuit may be modified without deviating from the scope of this disclosure. For example, any of the components (e.g., resistors, capacitors, diodes, transistors, LEDs, etc.) described herein may be implemented by a plurality of components. In this regard, any reference to “a” component should be understood as a reference to “one or more” of the same component.

Figure 2:
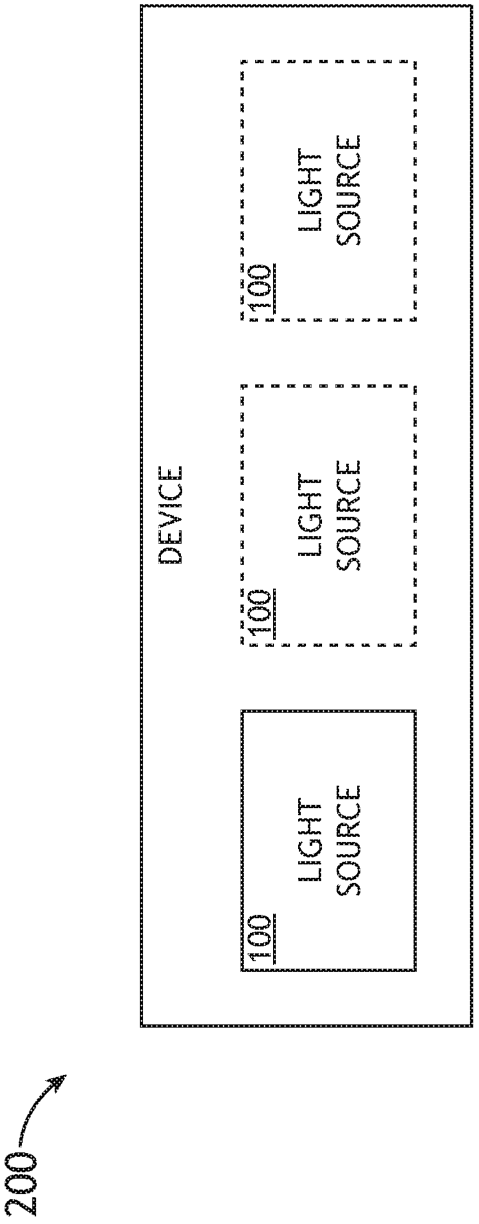
FIG. 2 is a block diagram illustrating a device that includes at least one light source, such as the light source illustrated in FIG. 1, in accordance with one or more embodiments of this disclosure.

As shown in FIG. 2, a device 200 may include one or more light sources, such as the light source 100 described herein. In some embodiments, the device 200 may be a light fixture (e.g., light strip, light panel, indicator light, reading light, or the like). For example, the device 200 may be an aircraft cabin lighting fixture. In other embodiments, the device 200 may be a user interface device (e.g., backlight switch, button, knob, keypad, keyboard, touch/proximity sensor, touchscreen, touch panel, or the like). For example, the device 200 may be an onboard user interface device for use by passengers or flight crew onboard an aircraft.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A light source including an illumination ramping circuit for a light-emitting diode (LED), comprising:
- a first control path including a first resistor in series with a first diode, the first control path configured to control an on time of the LED;
- a second control path including a second resistor in series with a second diode, the second control path configured to control an off time of the LED, the first and second control paths being in parallel with one another, in between a first node and a second node;
- a capacitor coupled between the second node and an electrical ground; and
- a transistor for switching the LED on and off, the transistor including a gate terminal coupled to the second node, wherein the first resistor and the second resistor are coupled in the second node with the capacitor and the transistor.

2. The light source including the illumination ramping circuit of claim 1, further comprising:
- a third resistor coupled between a source terminal of the transistor and the LED.

3. The light source including the illumination ramping circuit of claim 2, wherein the third resistor is coupled to an anode of the LED.

4. The light source including the illumination ramping circuit of claim 2, wherein the transistor further includes a drain terminal coupled to a power input for the LED.

5. The light source including the illumination ramping circuit of claim 2, further comprising:
- a fourth resistor coupled between an enable input and the first node; and
- a fifth resistor coupled between the enable input and the electrical ground.

6. The light source including the illumination ramping circuit of claim 1, wherein the first diode and the second diode are oppositely oriented in between the first node and the second node.

7. The light source including the illumination ramping circuit of claim 6, wherein the first node is coupled to an anode of the first diode and a cathode of the second diode, and the second node is coupled to a cathode of the first diode and an anode of the first diode.

8. The light source including the illumination ramping circuit of claim 7, wherein the first diode is coupled to the first node or the second node via the first resistor, and the second diode is coupled to the first node or the second node via the second resistor.

9. The light source including the illumination ramping circuit of claim 1, wherein at least one of the first and second resistors is adjustable.

10. A system, comprising:
- a lighting fixture device;
- a light source coupled to or embedded in the lighting fixture device, the light source including:
  - a light emitting diode (LED);
  - a first control path including a first resistor in series with a first diode, the first control path configured to control an on time of the LED;
  - a second control path including a second resistor in series with a second diode, the second control path configured to control an off time of the LED, the first and second control paths being in parallel with one another, in between a first node and a second node;
  - a capacitor coupled between the second node and an electrical ground; and
  - a transistor for switching the LED on and off, the transistor including a gate terminal coupled to the second node, wherein the first resistor and the second resistor are coupled in the second node with the capacitor and the transistor.

11. The system of claim 10, wherein the light source further includes:
- a third resistor coupled between a source terminal of the transistor and the LED.

12. The system of claim 11, wherein the third resistor is coupled to an anode of the LED.

13. The system of claim 11, wherein the transistor further includes a drain terminal coupled to a power input for the LED.

14. The system of claim 11, wherein the light source further includes:
- a fourth resistor coupled between an enable input and the first node; and
- a fifth resistor coupled between the enable input and the electrical ground.

15. The system of claim 10, wherein the first diode and the second diode are oppositely oriented in between the first node and the second node.

16. The system of claim 15, wherein the first node is coupled to an anode of the first diode and a cathode of the second diode, and the second node is coupled to a cathode of the first diode and an anode of the first diode.

17. The system of claim 16, wherein the first diode is coupled to the first node or the second node via the first resistor, and the second diode is coupled to the first node or the second node via the second resistor.

18. The system of claim 10, wherein at least one of the first and second resistors is adjustable.

* * * * *